United States Patent [19]

Satoh

[11] 4,266,507
[45] May 12, 1981

[54] CAP-MOUNTING MECHANISM FOR APPARATUS FOR THERMAL TREATMENT OF SEMICONDUCTORS

[75] Inventor: Ryozo Satoh, Yamato, Japan

[73] Assignee: Tel-Thermco Engineering Co., Ltd., Yokohama, Japan

[21] Appl. No.: 127,009

[22] Filed: Mar. 4, 1980

[30] Foreign Application Priority Data

Mar. 8, 1979 [JP] Japan .............................. 54-29726[U]

[51] Int. Cl.³ ............................................. C23C 13/08
[52] U.S. Cl. .................................................... 118/733
[58] Field of Search .................. 118/733, 715; 34/242; 148/174, 175, 189

[56] References Cited

U.S. PATENT DOCUMENTS

| | | | |
|---|---|---|---|
| 4,018,184 | 4/1977 | Nagasawa et al. | 118/733 |
| 4,154,192 | 5/1979 | Tsubouchi et al. | 427/255.1 X |
| 4,167,915 | 9/1979 | Toole et al. | 118/724 X |

*Primary Examiner*—Morris Kaplan
*Attorney, Agent, or Firm*—George R. Clark; Neil M. Rose; Allen J. Hoover

[57] ABSTRACT

In an apparatus for thermal treatment of semiconductors, a substantially spherical portion of a cap for a tube is confined between distal ends of a plurality of members and distal ends of a plurality of springs, whereby problems arising from angular deviation are overcome. The framework supporting the cap confining means is biased toward the tube.

7 Claims, 2 Drawing Figures 4,266,507

CAP-MOUNTING MECHANISM FOR APPARATUS FOR THERMAL TREATMENT OF SEMICONDUCTORS

BACKGROUND OF THE INVENTION

This invention relates generally to an apparatus of a type for thermal oxidation of silicon wafers, and for other processes of thermal treatment of silicon wafers and other semiconductors, and particularly to an improvement in a cap-mounting mechanism for the apparatus.

Prior apparatus of the type noted above are exemplified by Japanese (Laid-Open) Patent Publication No. 1977-154,360 of Tel-Thermco Engineering Co., Ltd., Japanese (Laid-Open) Patent Publication No. 1975-114,179 of Mitsubishi Denki Kabushiki Kaisha, U.S. Pat. No. 4,167,915 of Atomel Corporation, U.S. Pat. No. 4,154,192 of Mitsubishi Denki Kabushiki Kaisha, and U.S. Pat. No. 4,018,184 of Mitsubishi Denki Kabushiki Kaisha.

Other references of related interest include N. Tsuboushi H. Miyoshi, A. Nishimoto, and H. Abe, "Oxidation of Silicon in High-Pressure Steam", *Japan J. Appl. Phys.*, Vol. 16, No. 5, pp. 855–856, 1977, and N. Tsubouchi, H. Miyoshi, A. Nishimoto, H. Abe, and R. Satoh, "High-Pressure Steam Apparatus for Oxidation of Silicon", *Japan J. Appl. Phys.*, Vol. 16, No. 6, pp. 1055–1056, June 1977.

The apparatus of the patents and other references noted above are intended for thermal oxidation or other processes of thermal treatment of silicon wafers or other semiconductors at high pressures. Other forms of prior apparatus are intended for thermal treatment of silicon wafers or other semiconductors at low, ambient, or sub-ambient pressures.

Such apparatus are characterized by a tube, which is made of quartz, silicon carbide, or other refractory material of high purity and mechanical strength, and of chemical compatibility, and which is adapted to receive silicon wafers or other semiconductors to be treated, and a cap, which is made of the same material, and which is attachable to the tube, so as to enclose process gases within the tube, and which is detachable from the tube for insertion and removal of silicon wafers or other semiconductors through said end of the tube.

Conventionally, an open end of the cap fits onto an open end of the tube, near an outlet of the tube for process gases, so as to improve temperature distribution within the tube, and complementary sealing faces on the tube and the cap at their open ends enable a hermetic seal to be effected between the tube and the cap when the sealing faces are fitted to each other. Conical sealing faces are exemplified in Japanese (Laid-Open) Patent Publication No. 1977-154,360 of Tel-Thermco Engineering Co., Ltd., and in other references noted above.

Conventionally, the cap and a gripper, which grips the cap, are moved in mutually perpendicular directions (X and Y) at right angles to a longitudinal axis of the tube when the sealing faces are fitted to each other. However, if the cap has an uneven or irregular shape where the cap is gripped by the gripper, a longitudinal axis of the cap may be inclined slightly so as not to be parallel with the longitudinal axis of the tube, whereupon the sealing faces of the tube and the cap cannot be fitted to each other but interfere with each other. Thus, a hermetic seal cannot be effected between the tube and the cap, and the cap, the tube, or both can be broken.

This invention is addressed to a need for an improvement in the cap-mounting mechanism of an apparatus of the type noted above.

SUMMARY OF THE INVENTION

This invention may be embodied in an apparatus for thermal treatment of semiconductors, of a type comprising a tube, which has a longitudinal axis and an open end, and which is formed with a sealing surface near its open end, and a cap, which has an open end, and which is formed with a sealing surface near its open end. The sealing surface of the cap and the sealing surface of the tube are complementary to each other so as to enable a hermetic seal to be effected between the cap and the tube when the sealing surfaces are fitted to each other.

The apparatus also comprises a framework, which has a longitudinal axis, which carries the cap, which is movable along its longitudinal axis so as to carry the cap forwardly toward the tube and rearwardly, and which is movable in mutually perpendicular directions at right angles to the longitudinal axis of the framework.

Pursuant to this invention, the cap has a substantially spherical portion and a flared portion, on which the sealing surface of the cap is formed, and the apparatus comprises an annular retainer, which is integral to the framework, a plurality of elongated members, each of which has a proximal end attached to the annular retainer, and each of which extends radially inwardly from the annular retainer, and each of which has a distal end, and a plurality of leaf springs, each of which has a proximal end attached to the annular retainer, each of which extends radially inwardly from the annular retainer, and each of which has a distal end, the distal ends of the leaf springs being separated longitudinally from and rearwardly of the distal ends of the elongated members.

Also, the substantially spherical portion of the cap is confined by the distal ends of the elongated members and by the distal ends of the leaf springs except for the flared portion, which extends forwardly, past the distal ends of the elongated members, and toward the tube, so as to permit limited inclination of the cap with respect to the longitudinal axis of the framework, whereby the leaf springs impart elastic forces effecting self-alignment of the cap and the tube when the cap is pressed onto the tube, despite angular deviation between the longitudinal axis of the tube and the longitudinal axis of the framework.

Accordingly, the cap can be pressed by a uniform elastic force and held quite stably, even if the cap has an uneven or irregular outer shape. As a ball-joint effect facilitating self-alignment of the sealing surfaces thus is attained, the cap can be fitted on the tube quite safely.

Preferably, the flared portion of the cap is flared outwardly, the sealing surface of the cap fits around the sealing surface of the tube, the sealing surfaces are conical, and the framework is biased toward the tube.

These and other objects, features, and advantages of this invention will be evident from the following description of a preferred embodiment of this invention.

DETAILED DESCRIPTION OF PREFERRED EMBODIMENT

Figure 1:
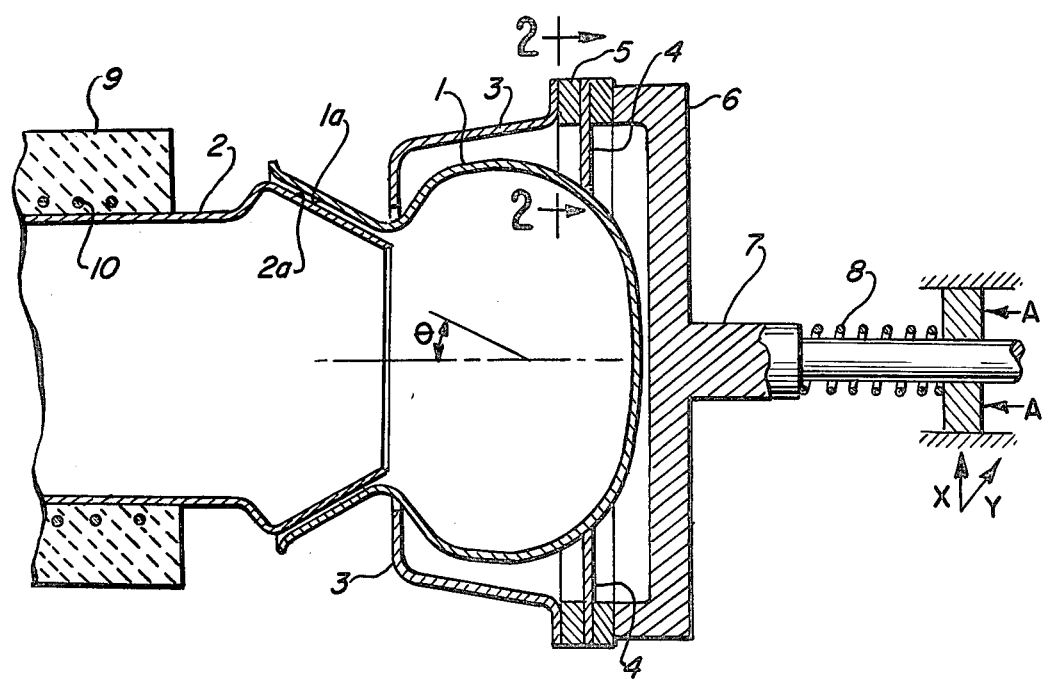
FIG. 1 is a fragmentary, longitudinal, sectional view of a quartz tube, a quartz cap, and a cap-mounting mechanism according to this invention.

As shown in FIG. 1, a quartz cap 1 is fitted onto a quartz tube 2, in an apparatus for thermal treatment of semiconductors. The cap 1 has a substantially spherical outer shape except for a conical, outwardly flared portion, on which is formed a sealing surface 1a near an open end of the cap 1. The tube 2 has a conical, inwardly flared portion, on which is formed a sealing surface 2a near an open end of the tube 2. The sealing surface 1a and the sealing surface 2a effect a hermetic seal between the cap 1 and the tube 2 when the sealing surface 1a and the sealing surface 2a are fitted to each other. The sealing surface 1a fits around the sealing surface 2a.

Figure 2:
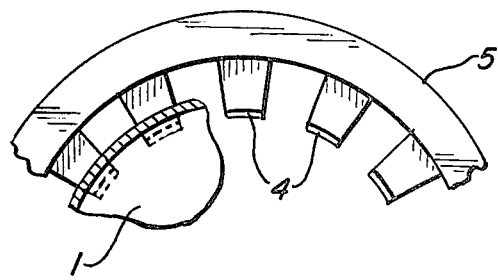
FIG. 2 is a fragmentary, sectional view taken along line 2—2 of FIG. 1 in the direction of the arrows.

The cap 1 is mounted to the tube 2 by means of a capmounting mechanism comprising a plurality of elongated members 3, two of which appear in longitudinal section of FIG. 1, and a plurality of leaf springs 4, two of which appear in longitudinal section in FIG. 1, and an annular retainer 5, to which the members 3 and the springs 4 are attached. Several of the springs 4, which are arrayed about the annular retainer 5, also appear in FIG. 2. The members 3 are arrayed similarly.

Each of the members 3 has a proximal end, which is attached to the annular retainer 5, and a distal end. Each of the members 3 extends radially inwardly from the annular retainer 5. Each of the members 3 is bent doubly, as shown in FIG. 1, so as to displace its distal end longitudinally from and forwardly of its proximal end.

Each of the springs 4 has a proximal end, which is attached to the annular retainer 5, and a distal end. Each of the springs 4 extends radially from the annular retainer 5. Because the members 3 are bent doubly, as noted above, the distal ends of the springs 4 are separated longitudinally from and rearwardly of the distal ends of the strips 3.

A framework carrying the cap 1, as described below, and comprising a bowl-like member 6 and a push rod 7, which is integral to the bowl-like member 6, is movable along a longitudinal axis of the framework in a longitudinal direction, as indicated by an arrow A, so as to carry the cap 1 forwardly toward the tube 2. Also, the framework is movable in mutually perpendicular directions, as indicated by an arrow X and by an arrow Y, at right angles to the longitudinal axis of the framework.

The annular retainer 5 is attached to the bowl-like member 6 of the framework. A coiled spring 8 is piloted around the push rod 7 so as to bias the framework, as indicated by the arrow A, toward the tube 2.

The tube 2 is carried by a sleeve 9 of heat-insulating material. A coiled heater 10, which is used to heat semiconductors (not shown) in the tube 2, is embedded within the sleeve 9 near the tube 2.

The cap 1 is confined by the distal ends of the members 3 and by the distal ends of the springs 4 except for the flared portion, which extends forwardly, past the distal ends of the members 3, and toward the tube 1, so as to permit limited inclination of the cap 1 with respect to the longitudinal axis of the framework, as indicated by an angle θ in FIG. 1. Accordingly, the springs 4 impart elastic forces effecting self-alignment of the cap 1 and the tube 2 when the cap 1 is pressed onto the tube 2, despite angular deviation between the longitudinal axis of the tube and the longitudinal axis of the framework.

As the substantially spherical portion of the cap 1 is pressed by the distal ends of the springs 4, as the cap 1 is confined by the distal ends of the members 3, as the cap 1 is pushed forwardly by the framework, which is arranged movably in the longitudinal direction indicated by the arrow A, and in mutually perpendicular directions indicated by the arrow X and the arrow Y at right angles to said longitudinal direction, the sealing face 1a of the cap 1 is fitted on the sealing face 2a of the tube 2 while self-alignment is effected by elastic forces imparted on the cap 1 by the springs 4. The coiled spring 8 biases the framework in the longitudinal direction indicated by the arrow A. Conventional means (not shown) may be used to move the framework in the vertical direction indicated by the arrow X and in the lateral direction indicated by the arrow X.

As the springs 4 are arranged radially around the annular retainer 5, and as the substantially spherical portion of the cap 1 is confined by the distal ends of the springs and by the distal ends of the members 3, the cap 1 can be held by a substantially uniform force even if the cap 1 is uneven or irregular in shape. Furthermore, since a ball-joint effect thus is attained at the substantially spherical portion of the cap 1, self-alignment is manifested, and there is no interference between the sealing face of the tube and the sealing face of the cap 1 even if there is angular deviation equal to the angle θ. Accordingly, the cap 1 is fitted smoothly and safely onto the tube 1, and a hermetic seal between the cap 1 and the tube 2 is effected easily.

I claim:

1. In an apparatus for thermal treatment of semiconductors, of a type comprising
    (a) a tube, which has a longitudinal axis, and which is formed with a sealing surface near an open end of the tube,
    (b) a cap, which is formed with a sealing surface near an open end of the cap, and which fits onto the tube so as to effect a hermetic seal between the cap and the tube when the sealing surfaces are fitted to each other, and
    (c) a framework, which has a longitudinal axis, which carries the cap, which is movable along the longitudinal axis of the framework so as to carry the cap forwardly toward the tube, and which is movable in mutually perpendicular directions at right angles to the longitudinal axis of the framework, an improvement wherein the cap has a substantially spherical portion and a flared portion, on which the sealing surface of the cap is formed, and wherein the apparatus comprises
    (d) an annular retainer, which is integral to the framework,
    (e) a plurality of elongated members, each of which has a proximal end attached to the annular retainer, each of which extends radially inwardly from the annular retainer, and each of which has a distal end,
    (f) a plurality of leaf springs, each of which has proximal end attached to the annular retainer, each of which extends radially inwardly from the annular retainer, and each of which has a distal end, the distal ends of the leaf springs being separated longitudinally from and rearwardly of the distal ends of the elongated members and wherein the substantially spherical portion of the cap is confined by the distal ends of the elongated members and by the distal ends of the leaf springs except for the flared portion, which extends forwardly, past the distal ends of the elongated members, and toward the tube, so as to permit limited inclination of the cap with respect to the longitudinal axis of the framework, whereby the leaf springs impart elastic forces effecting self-alignment of the cap and the tube when the cap is pressed onto the tube, despite angular deviation between the longitudinal axis of the tube and the longitudinal axis of the framework, and (g) means associated with said framework to hold said cap in sealed engagement with said tube.

2. The improvement of claim 1 wherein the flared portion of the cap is flared outwardly.

3. The improvement of claim 2 wherein the sealing surface of the cap fits around the sealing surface of the tube.

4. The improvement of claim 1 wherein the sealing surfaces are conical.

5. The improvement of claim 4 wherein the flared portion of the cap is flared outwardly.

6. The improvement of claim 5 wherein the sealing surface of the cap fits around the sealing surface of the tube.

7. The improvement of any of claims 1 through 6 wherein said means bias the framework toward the tube.

* * * * *